(12) United States Patent
Formosa

(10) Patent No.: US 8,970,092 B2
(45) Date of Patent: Mar. 3, 2015

(54) ELECTRICITY GENERATOR HAVING RECOVERY OF ENERGY FROM MECHANICAL VIBRATIONS

(75) Inventor: Fabien Formosa, Annecy le Vieux (FR)

(73) Assignee: Universite de Savoie, Chambery Cedex (FR)

( * ) Notice: Subject to any disclaimer, the term of this patent is extended or adjusted under 35 U.S.C. 154(b) by 234 days.

(21) Appl. No.: 13/516,471

(22) PCT Filed: Dec. 17, 2010

(86) PCT No.: PCT/FR2010/052789
§ 371 (c)(1),
(2), (4) Date: Aug. 9, 2012

(87) PCT Pub. No.: WO2011/073591
PCT Pub. Date: Jun. 23, 2011

(65) Prior Publication Data
US 2012/0319532 A1    Dec. 20, 2012

(30) Foreign Application Priority Data

Dec. 17, 2009   (FR) ..................................... 09 59097
Dec. 17, 2010   (WO) ................. PCT/FR2010/052789

(51) Int. Cl.
*F03G 7/08*    (2006.01)
*H01L 41/113*  (2006.01)
*H02N 2/18*    (2006.01)

(52) U.S. Cl.
CPC ............ *H01L 41/1134* (2013.01); *H02N 2/186* (2013.01)

USPC .......................................... 310/329; 310/339

(58) Field of Classification Search
CPC ....... H02N 2/18; F23Q 3/002; H01L 41/1136
USPC ................................................... 310/329, 339
See application file for complete search history.

(56) References Cited

U.S. PATENT DOCUMENTS

| 7,034,440 | B2* | 4/2006 | Kim et al. | 310/339 |
|---|---|---|---|---|
| 7,579,755 | B2* | 8/2009 | Clingman | 310/328 |
| 7,737,608 | B2* | 6/2010 | Ruggeri et al. | 310/339 |
| 2004/0007942 | A1* | 1/2004 | Nishida et al. | 310/314 |
| 2005/0093398 | A1* | 5/2005 | Kim et al. | 310/324 |
| 2006/0202592 | A1* | 9/2006 | Ruggeri et al. | 310/349 |
| 2010/0295655 | A1* | 11/2010 | Pannek | 340/3.1 |

FOREIGN PATENT DOCUMENTS

| DE | 102007022430 A1 | 3/2008 |
|---|---|---|
| WO | 02/061857 A1 | 8/2002 |

(Continued)

OTHER PUBLICATIONS

International Search Report dated May 9, 2011 for related application No. PCT/FR2010/052789.

*Primary Examiner* — Derek Rosenau
*Assistant Examiner* — Bryan Gordon
(74) *Attorney, Agent, or Firm* — Howard IP Law Group, PC

(57) ABSTRACT

The invention relates to an electricity generator having recovery of mechanical vibration energy, including a bistable system suitable for adopting one stable position or another relative to two ends in response to being energized in a predetermined direction ($F_{EXT}$); at least one monostable oscillating system suitable for periodically engaging with at least one of the two ends, in response to said energizing; and a device for converting the movement of the element of the bistable system into electric power.

9 Claims, 2 Drawing Sheets

(56) References Cited

FOREIGN PATENT DOCUMENTS

| WO | 2005/036728 | A2 | 4/2005 |
| WO | 2007038157 | A2 | 4/2007 |
| WO | 2008/005113 | A2 | 1/2008 |
| WO | 2008099437 | A1 | 8/2008 |

* cited by examiner

ELECTRICITY GENERATOR HAVING RECOVERY OF ENERGY FROM MECHANICAL VIBRATIONS

CROSS-REFERENCE TO RELATED APPLICATIONS

This application is the national stage application under 35 U.S.C. §371 of International Application No. PCT/FR2010/052789 and claims the benefit of Intl Application No. PCT/FR2010/052789, filed Dec. 17, 2010 and French application Ser. No. 09/59097, filed Dec. 17, 2009, the entire disclosures of which are incorporated herein by reference in their entireties.

FIELD OF THE INVENTION

The present invention relates to a generator capable of generating electric energy from mechanical vibrations. It especially aims at the generation of electric energy by recovery of the mechanical vibration energy generated by certain pieces of equipment, for example, air conditioning ducts of a building, operating computers, industrial machines, etc.

DISCUSSION OF PRIOR ART

To power certain low-consumption electronic systems, for example, occupancy or temperature sensors in a building, it has been provided to use generators capable of converting the mechanical energy of environment vibrations into electric energy. This especially enable to form fully stand-alone wireless sensors, which are thus easier to install and do not require repeated expensive battery replacement operations. More generally, the recovery of vibration energy has obvious practical, economical, and environmental advantages.

FIG. 1 is a very simplified side view illustrating the operating principle of a mechanical vibration energy recovery electric generator 1 of monostable type.

Generator 1 comprises a protection and support package 3, of generally parallelepipedal shape, capable of being assembled on a vibrating surface. In this example, external vibrations are capable of exciting package 3 in a way which can be schematically accounted for by a force of orientation $F_{EXT}$, substantially orthogonal to the lower surface of the package. Package 3 contains a spring blade 5, attached by one of its ends to a lateral surface of the package, and having its other end left free. At rest, blade 5 is substantially orthogonal to orientation $F_{EXT}$ of the external excitation. A mass 7 is attached to blade 5, on the side of its free end, to form a monostable mass-spring type oscillating system.

Under the effect of external mechanical vibrations, transmitted by package 3, blade 5 and mass 7 oscillate up and down around an equilibrium position. In the drawing, the equilibrium position is shown in a full line and the oscillating motion is illustrated by dotted lines.

A mechanoelectrical converter, not shown, is provided to convert the motion of blade 5 and/or of ground 7 into electric energy. It may be a piezoelectric-type converter.

A disadvantage of such an energy recovery device is that it only has a good efficiency when the frequency of the external vibrations corresponds to the resonance frequency of the oscillating system formed by mass 7 and blade 5. Now, the spectrum of the vibration frequencies present in the environment is generally quite wide and may be variable. Thus, generator 1 only recovers a small fraction of the mechanical energy of environment vibrations.

Further, vibration frequencies currently present in the environment are generally quite low, that is, they do not exceed from a few tens to a few hundreds of Hz. Now, the current tendency to miniaturize electronic device results in decreasing the dimensions of generator 1, and especially the dimensions of the oscillating system formed by blade 5 and mass 7. This inevitably results in an increase of the resonance frequency of the oscillating system. Thus, such an energy recovery device has a poor mechanoelectrical conversion efficiency.

FIG. 2 is a very simplified side view illustrating the operating principle of a mechanical vibration energy recovery electric generator 11 of bistable type.

Like generator 1 of FIG. 1, generator 11 comprises a package 13 capable of being excited by external vibrations symbolized by a force of orientation $F_{EXT}$, orthogonal to the lower surface of the package. Package 13 contains a spring blade 15 having its two ends bearing, in compression, against two opposite lateral surfaces of the package. The two bearing points of blade 15 on package 13 are located along an axis substantially orthogonal to orientation $F_{EXT}$ of the vibrations. A mass 17 is attached to blade 15, substantially at its center. Blade 15, in compression between its two ends, defines with mass 17 a non-linear or bistable system which may, under the effect of external vibrations, switch from one to the other of two stable equilibrium positions (respectively shown in a full line and in a dotted line in the drawing). This system may also oscillate around each of the two equilibrium positions.

A mechanoelectrical converter, not shown, is provided to convert motions into electric energy.

Jumps from one to the other of the equilibrium positions are directly linked to the amount of mechanical vibration energy transmitted by the package, and not to the frequency of the vibrations. Such jumps do not necessarily occur periodically.

Thus, generator 11, of bistable type, has the advantage over generator 1 of FIG. 1, of monostable type, of more widely exploiting the vibration frequency spectrum of the environment.

However, the energy level of external vibrations must be sufficient to cause, as often as possible, jumps from one equilibrium position to the other. Below a given vibration energy level, such jumps do not occur. In this case, the generation of electric energy is only linked to the oscillations around one of the two equilibrium positions, and only the fraction of vibration energy corresponding to the resonance frequency of the device is recovered. The efficiency of generator 11 is then much lower.

SUMMARY

Thus, an object of an embodiment of the present invention is to provide a mechanical vibration energy recovery electric generator overcoming all or part of the disadvantages of current generators.

An object of an embodiment of the present invention is to provide such a generator which has a greater efficiency than current converters.

An object of an embodiment of the present invention is to provide such a generator capable of operating from a wide vibration frequency range.

An object of an embodiment of the present invention is to provide such a generator having an efficiency which remains good even when the energy level of the vibration is low.

Thus, an embodiment of the present invention provides a mechanical vibration energy recovery electric generator, comprising: a bistable system capable of taking one or other of two stable positions with respect to two ends, as a response to an excitation of given orientation; at least one monostable oscillating system capable of periodically acting on one at least of the two ends, as a response to said excitation; and a converter of the motion of an element of the bistable system into electric energy.

According to an embodiment of the present invention, the monostable oscillating system comprises: a first ring-shaped spring blade, attached at a first point to a support; and a first mass, attached to the first blade at a second point of the ring opposite to the first point, the axis formed by the first and second points being non-orthogonal to said orientation; and the bistable system comprises: a second spring blade, in compression between two points of the ring forming said ends, said ends belonging to a chord of the ring which is not parallel to said orientation; and a second mass attached to the second blade.

According to an embodiment of the present invention, the converter comprises at least one piezoelectric element arranged on the second blade.

According to an embodiment of the present invention, the generator comprises a plurality of bistable systems arranged so that the monostable system is capable of simultaneously acting on each of the bistable systems.

According to an embodiment of the present invention, the monostable oscillating system comprises: first and second arc-shaped spring blades, in front of each other, each blade being attached by its ends to a rigid support package, the point of attachment of each blade being arranged along a line which is not orthogonal to said orientation; and first and second masses, each mass being attached to an intermediate point of one of the blades via a rigid connection which is not parallel to said orientation; and the bistable system comprises: a third spring blade in compression between the first and second blades, the bearing points of the third blade on the first and second blades forming said ends, such bearing points being arranged along a line which is not parallel to said orientation; and a third mass, attached to the third blade.

According to an embodiment of the present invention, the converter comprises at least one piezoelectric element arranged on said third blade.

According to an embodiment of the present invention, the bistable system comprises: a beam having a cross-shaped section with terminations forming said ends, the beam being attached to a support by a first termination and being arranged parallel to said orientation; and a spring system for maintaining the beam in compression between its terminations so that it is capable of taking one or the other of two stable positions corresponding to the deformation of the beam by buckling according to one or the other of two opposite rotation directions; and the monostable oscillating system comprises, on the side of a second termination of the beam, at least one mass capable of acting on the spring system, as a response to said excitation.

According to an embodiment of the present invention, the spring system comprises a resilient core thoroughly crossing the beam lengthwise, this core being attached, under tension, to each of the beam terminations.

According to an embodiment of the present invention, said mass is connected to the second termination of the beam via a rigid arm orthogonal to said orientation.

According to an embodiment of the present invention, the converter comprises at least one piezoelectric element arranged on the beam.

BRIEF DESCRIPTION OF THE DRAWINGS

The foregoing and other objects, features and advantages of the present invention will be discussed in detail in the following non-limiting description of specific embodiments in connection with the accompanying drawings, among which.

DETAILED DESCRIPTION

Figure 1:
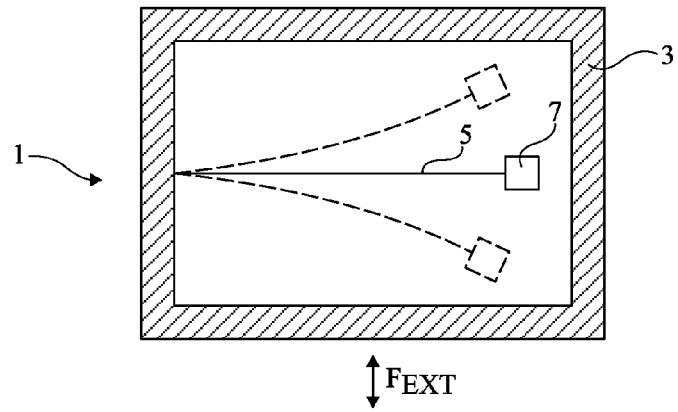
FIG. 1, previously described, is a very simplified side view of a mechanical vibration energy recovery electric generator, of monostable type.

For clarity, the same elements have been designated with the same reference numerals in the different drawings and, further, the various drawings are not to scale.

Figure 3:
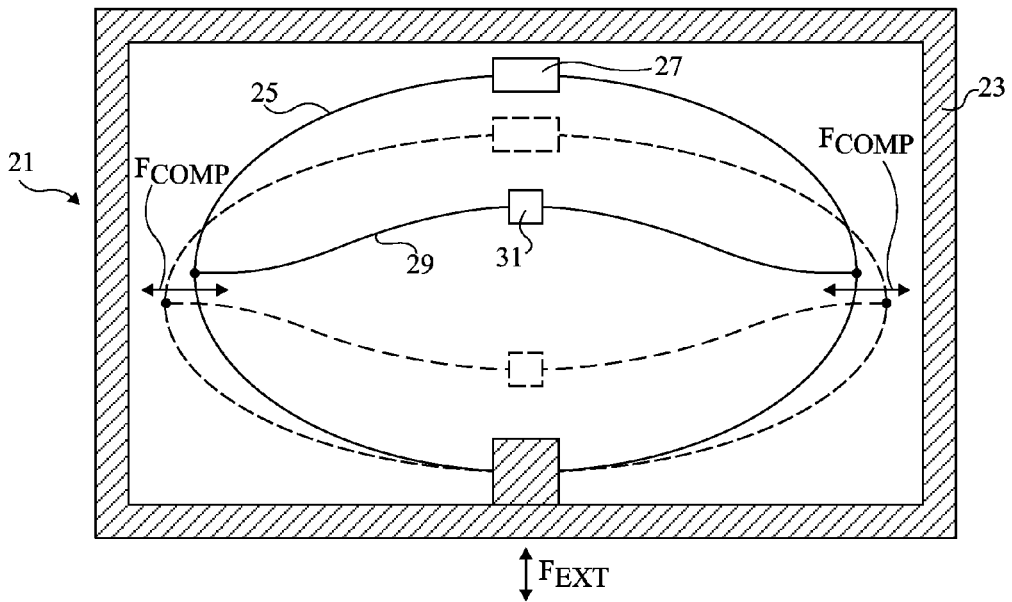
FIG. 3 is a side view schematically showing an embodiment of a mechanical vibration energy recovery electric generator.

FIG. 3 is a side view schematically showing an embodiment of a mechanical vibration energy recovery electric generator 21.

Generator 21 comprises a protection and support package 23, for example, of generally parallelepipedal shape, capable of being assembled on a vibrating surface. In this example, the external vibrations are capable of exerting, on package 23, an excitation $F_{EXT}$ substantially orthogonal to the lower surface of the package.

Package 23 contains a monostable oscillating system comprising a ring-shaped spring blade 25, and a mass 27. Ring 25 is attached, at one point, to a surface of package 23, here the lower surface. Mass 27 is attached to ring 25 at a point of the ring substantially opposite to the point of attachment of the ring to the package. Thus, the point of attachment of the ring to the package and the point of attachment of the mass to the ring define a line substantially parallel to orientation $F_{EXT}$ of the external excitation. More generally, it will be ascertained that this line is not orthogonal to orientation $F_{EXT}$ of the external vibrations.

Under the effect of external mechanical vibrations, ring 25 and mass 27 oscillate up and down around an equilibrium position. In the drawing, a low position is illustrated by dotted lines.

The system further comprises a bistable system coupled to the monostable system, comprising a spring blade 29 in compression between its two ends. In this example, the ends of blade 29 bear against two opposite points of ring 25, and these two bearing points define a line substantially orthogonal to orientation $F_{EXT}$ of the external vibrations. More generally, it will be ascertained that the bearing points of blade 29 on ring 25 define a line which is not parallel to orientation $F_{EXT}$ of the vibrations. Ring 25 exerts on blade 29 a compressive force $F_{COMP}$, maintaining blade 29 in compression between its two ends. A mass 31 is attached to blade 29, substantially at its center in this example.

Figure 2:
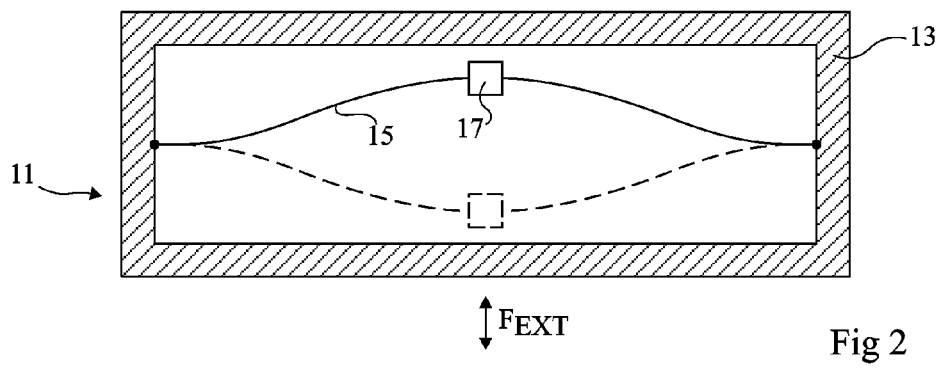
FIG. 2, previously described, is a very simplified side view of a mechanical vibration energy recovery electric generator, of bistable type.

Blade 29 and mass 31, define a bistable system of the type described in relation with FIG. 2. This system may, under the effect of external vibrations, switch from one to the other of two equilibrium positions, and/or oscillate around each of the two equilibrium positions.

In generator 21, the bistable system is coupled to the monostable oscillating system in such a way that the value of force $F_{COMP}$, which maintains blade 29 of the bistable system in compression, varies periodically, substantially at the monostable system resonance frequency. Indeed, when the monostable system oscillates, the points of attachment of blade 29 to ring 25 tend to draw away from each other, and then to come closer to each other, inducing a decrease of the force exerted on the ends of blade 29, followed by an increase thereof.

When compressive force $F_{COMP}$ varies, the minimum vibration energy level necessary to trigger the switching of the bistable system from one equilibrium position to the other varies accordingly.

The inventor has observed that, when compressive force Fcomp varies periodically, the minimum external excitation level necessary to cause a given number of position jumps of the bistable system within a given time interval significantly decreases with respect to the same in a conventional bistable system where $F_{COMP}$ is constant (for equivalent average values of $F_{COMP}$).

An advantage of the provided device is that the mechanical energy of the external vibration itself enables to periodically vary force $F_{COMP}$. Thus, it is not necessary to provide an external actuator provided with a dedicated power supply.

A mechanoelectrical converter, not shown, is provided to convert the motion of blade 29 and/or of ground 31 into electric energy. It may be a converter of piezoelectric type, for example piezoelectric elements placed on blade 29, towards the ends thereof, capable of undergoing the deformations of the blade on switching from one to the other of the equilibrium positions, and during linear oscillations around one or the other of the equilibrium positions. It may be also be a converter of electromagnetic or electrostatic type.

As an example, ring 25 may be formed from a steel ring having a width approximately ranging between 5 and 50 mm, for example, on the order of 20 mm, and a thickness approximately ranging from 100 to 500 µm, for example, on the order of 200 µm. The ring may be substantially circular at rest and have a diameter approximately ranging from 50 to 100 mm, for example, on the order of 70 mm. Mass 27 may have a weight approximately ranging from 5 to 25 g, for example on the order of 10 g. Blade 29 of the bistable system may be formed from a steel ring having a width approximately ranging from 5 to 50 mm, for example, on the order of 20 mm, and having a thickness approximately ranging from 50 to 250 µm, for example, on the order of 75 µm. Mass 31 may have a weight approximately ranging from 2 to 15 g, for example, on the order of 5 g. Masses 27 and 31 may be respectively attached to blade 31 and to ring 25 by gluing. Of course, such dimensions are given as an example only. In practice, the system dimensions may range between a few tenths of a mm and a few tens of cm.

According to an alternative embodiment, not shown, it is provided to arrange, against the walls of ring 25, several bistable systems such as that formed by blade 29 and mass 31.

Figure 4:
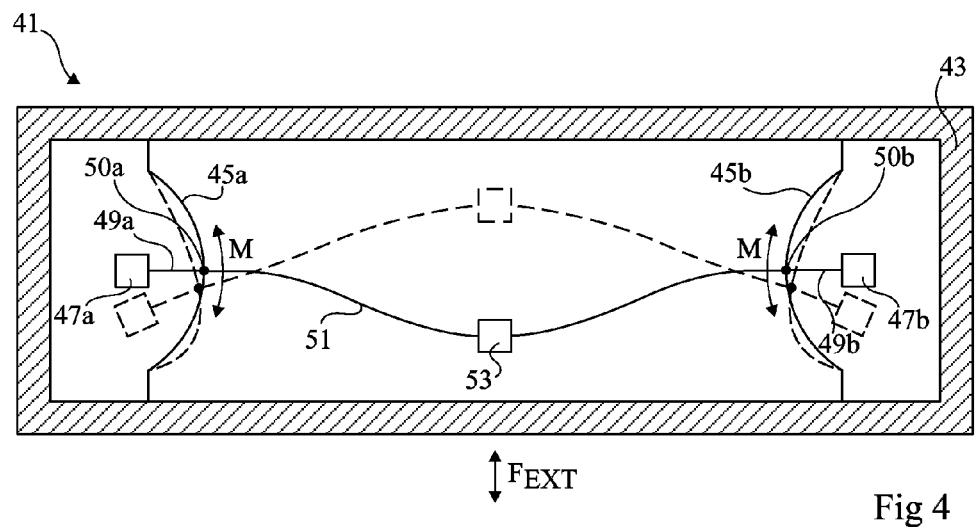
FIG. 4 is a side view schematically showing another embodiment of a mechanical vibration energy recovery electric generator.

FIG. 4 is a side view schematically showing another embodiment of a mechanical vibration energy recovery electric generator 41.

Like generator 21 of FIG. 3, generator 41 comprises a rigid support package 43 capable of being excited by external vibrations of orientation $F_{EXT}$, orthogonal to the lower surface of the package.

Package 43 contains a double monostable oscillating system comprising two spring blades 45a and 45b, each being arc-shaped. Blades 45a and 45b face each other. Each blade has one of its ends attached to the upper surface of the package and its other end attached to the lower surface of the package. In this example, the points of attachment of each blade to the package define a line substantially parallel to orientation $F_{EXT}$ of the external vibrations. Masses 47a and 47b are respectively attached to blades 45a and 45b, via rigid connections 49a and 49b. In this example, rigid connections 49a and 49b are orthogonal to orientation $F_{EXT}$ of the external vibrations, and are connected to blades 45a and 45b at their centers 50a and 50b.

Under the effect of external mechanical vibrations, spring blades 45a and 45b deform, and masses 47a and 47b oscillate around an equilibrium position, which causes a rotational oscillation of points 50a and 50b, around an axis substantially orthogonal to the plane of FIG. 4, as well as a substantially vertical oscillation of points 50a and 50b. The oscillating motion is illustrated by dotted lines in the drawing. Spring blades 45a and 45b, associated with masses 47a and 47b via rigid connections 49a and 49b, form a double monostable system.

Package 43 further contains a bistable system comprising a spring blade 51, having its ends respectively attached to blades 45a and 45b, preferably at points 50a and 50b. The spacing between blades 45a and 45b is such that blade 51 is maintained in compression between its two ends. A mass 53 is attached to blade 51, for example, at its center.

When the double monostable system oscillates, the action of the deformation of blades 45a and 45b on each end of blade 51 of the bistable system can be modeled by a moment M. Moment M periodically varies, substantially at the resonance frequency of the monostable system.

When moment M varies, the minimum vibration energy level necessary to trigger the switching of the bistable system from one equilibrium position to the other varies simultaneously. Thus, like for generator 21 of FIG. 3, the minimum excitation level necessary to cause position jumps of the bistable system is much lower than for a conventional bistable system. Similarly, for a given external excitation level, the number of position jumps within a given time interval may be greater than for a conventional bistable system.

A mechanoelectrical converter, not shown, is provided to convert the motion of blade 51 and/or of ground 53 into electric energy.

As a variation, an electric generator similar to generator 41 of FIG. 4, however comprising a simple monostable system acting on a single one of the ends of blade 51, the other end being connected to a fixed point, may be provided.

Figure 5:
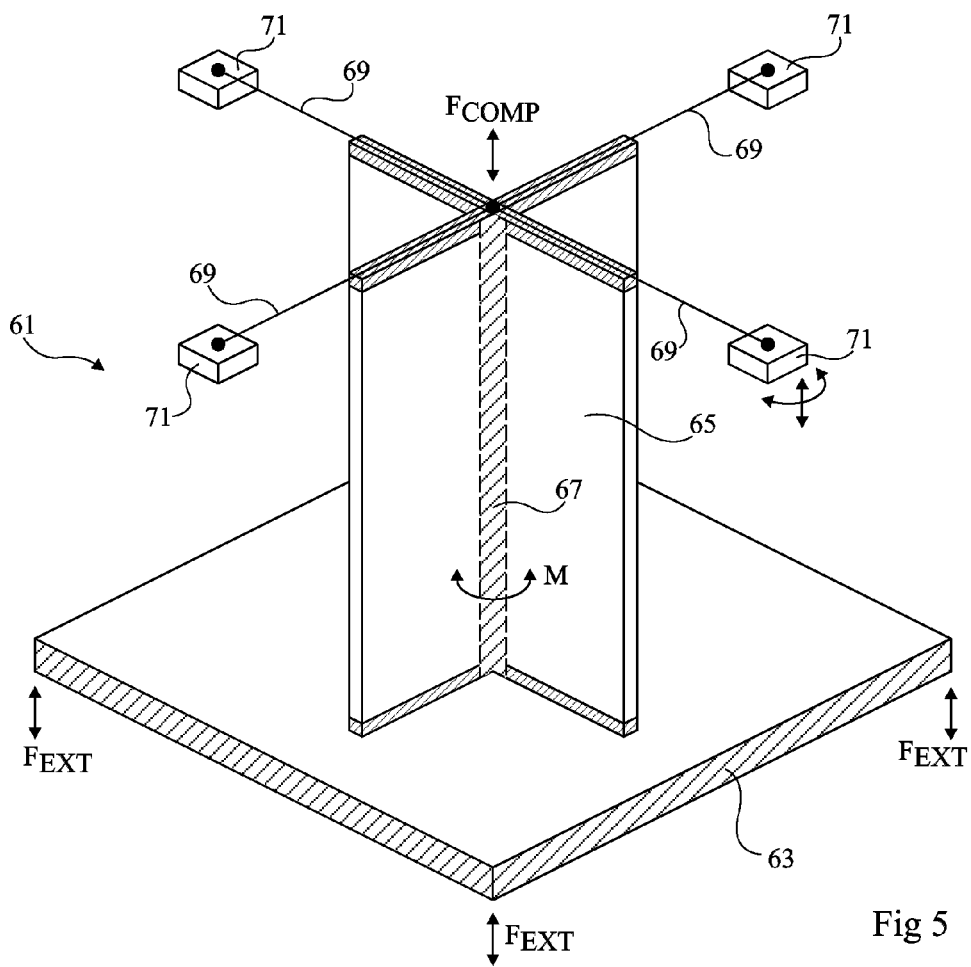
FIG. 5 is a perspective view schematically showing another embodiment of a mechanical vibration energy recovery electric generator.

FIG. 5 is a perspective view schematically showing another embodiment of a mechanical vibration energy recovery electric generator 61.

Generator 61 comprises a support package 63 capable of being excited by external vibrations of orientation $F_{EXT}$, orthogonal to the lower surface of the package. For more clarity, only the lower surface of package 63 is shown in the drawing.

Package 63 contains a beam with a cross-shaped section 65. Beam 65 is attached by one of its ends to a surface of package 63, here the lower surface, so that the beam is substantially parallel to orientation $F_{EXT}$ of the external vibrations. Although, in this example, beam 65 is a beam with a cross-shaped section, the invention is not limited to this specific case, and it may be a beam with a section in the shape of a star having any other number of branches (greater than or equal to three).

A spring system, shown by hatchings, is provided to maintain the beam in compression between its ends. In this example, it is a resilient central core 67 (or prestressed spring) which thoroughly crosses the beam lengthwise, this central core being connected, under tension, to the lower and upper ends of the beam.

Beam 65 is submitted, between its ends, to a substantially vertical compressive force $F_{COMP}$, resulting from the tension of spring 67. Spring 67 is selected to be such that force $F_{COMP}$ is sufficiently large to cause a buckling (not shown) of the beam according to one or the other of two opposite rotation directions (around the central axis of the beam).

As a result of this buckling, beam 65 is submitted, between its ends, in addition to compressive force $F_{COMP}$, to a torsion force, where this torsion force can be modeled by a moment M around an axis substantially parallel to the central axis of the beam.

Further, a mass system 71 is connected to the free end of the beam (here, the upper end). In this embodiment, on the upper end side of the beams, a rigid arm 69, extending along a direction orthogonal to the central axis of the beam, is attached to each branch of the beam, thus prolonging the branch to which it is attached. The end of each arm 69, towards the outside of the beam, has a mass 71 attached thereto.

Beam 65, in compression and in torsion between its ends, forms a bistable system capable of switching, under the effect of an external excitation, from one to the other of two stable positions, the two stable positions corresponding to the beam buckling according to one and the other of the two rotation directions. In particular, beam 65 is capable of passing from one to the other of the two buckling positions under the effect of a rotational excitation of its ends.

Further, spring 67 and mass system 71, which is solidly attached to the upper end of spring 67, define a monostable oscillating system. Under the effect of outer mechanical vibrations, masses 71 oscillate up and down around an equilibrium position. During such oscillations, the torsion (buckling) of beam 65 varies around one of the beam buckling positions. Since masses 71 are offset with respect to the central axis of the beam, linear torsion oscillations of beam 65 cause a rotating motion of masses 71 around the central axis of the beam. Thus, the oscillations of masses 71 cause a periodic variation of compressive force $F_{COMP}$ and of torsion moment M, to which the ends of beam 65 are submitted.

This results, as for the embodiments described in relation with FIGS. 3 and 4, in a significant decrease of the minimum level of vibration energy necessary to trigger the switching from one to the other of the equilibrium positions of the bistable system. Similarly, to trigger a given number of position jumps within a given time interval, the required vibration energy level is lower than for a conventional bistable system.

A mechanoelectrical converter, not shown, is provided to convert the rotating motions of the beam and the branch deformations into electric energy.

An advantage of the provided vibration energy recovery electric generators is that they have a greater efficiency than current generators.

Another advantage of the provided vibration energy recovery electric generators is that they exploit a wide range of vibration frequencies. Further, their efficiency remains high, even when the vibration energy level is low.

Various embodiments of a vibration energy recovery electric generator have been described hereabove. More generally, an aspect of the present invention is to provide a mechanical vibration energy recovery electric generator comprising a bistable system capable of taking one or the other of two stable positions as a response to a given excitation, and a monostable oscillating system capable of periodically acting on the bistable system, under the effect of this same excitation, to vary the vibration energy level necessary to trigger the switching of the bistable system from one of its equilibrium positions to the other.

Specific embodiments of the present invention have been described. Various alterations, modifications, and improvements will readily occur to those skilled in the art.

In particular, in each of the above-described embodiments, the oscillating structure is attached to the support and protection package at one or several attachment points. It will be within the abilities of those skilled in the art to provide alternative embodiments in which the number and the position of the attachment points differ from those in the above-discussed examples.

Further, the invention is not limited to a parallelepipedal geometry of the generator package, such as mentioned hereabove.

The invention claimed is:

1. A mechanical vibration energy recovery electric generator, comprising:
   a bistable system capable of taking one or the other of two stable positions with respect to two ends, as a response to an excitation of given orientation (FEXT);
   at least one monostable oscillating system capable of periodically acting on at least one of the two ends, as a response to said excitation; and
   a converter of the motion of an element of the bistable system into electric energy;
   wherein:
   the monostable oscillating system comprises: first and second arc-shaped blades, in front of each other, each blade being attached by its ends to a rigid support package, the point of attachment of each blade being arranged along a line which is not orthogonal to said orientation (FEXT); and first and second masses, each mass being attached to an intermediate point of one of the blades via a rigid connection which is not parallel to said orientation (FEXT); and
   the bistable system comprises: a third spring blade in compression between the first and second blades, the bearing points of the third blade on the first and second blades forming said ends, such bearing points being arranged along a line which is not parallel to said orientation (FEXT); and a third mass, attached to the third blade.

2. The generator of claim 1, wherein said converter comprises at least one piezoelectric element arranged on said third blade.

3. A mechanical vibration energy recovery electric generator, comprising:
   a bistable system capable of taking one or the other of two stable positions with respect to two ends, as a response to an excitation of given orientation (FEXT);
   at least one monostable oscillating system capable of periodically acting on at least one of the two ends, as a response to said excitation; and
   a converter of the motion of an element of the bistable system into electric energy;
   wherein:
   the bistable system comprises: a beam having a cross-shaped section with terminations forming said ends, the beam being attached to a support by a first termination and being arranged parallel to said orientation (FEXT); and a spring system for maintaining the beam in compression between its terminations so that it is capable of taking one or the other of two stable positions corresponding to the deformation of the beam by buckling according to one or the other of two opposite rotation directions; and the monostable oscillating system comprises, on the side of a second termination of the beam, at least one mass capable of acting on the spring system, as a response to said excitation.

4. The generator of claim 3, wherein the spring system comprises a resilient core thoroughly crossing the beam lengthwise, the resilient core being attached, under tension, to each of the beam terminations.

5. The generator of claim 3, wherein said at least one mass is connected to the second termination of the beam via a rigid arm orthogonal to said orientation (FEXT).

6. The generator of claim 3, wherein the converter comprises at least one piezoelectric element arranged on the beam.

7. The generator of claim 4, wherein said at least one mass is connected to the second termination of the beam via a rigid arm orthogonal to said orientation (FEXT).

8. The generator of claim 4, wherein the converter comprises at least one piezoelectric element arranged on the beam.

9. The generator of claim 5, wherein the converter comprises at least one piezoelectric element arranged on the beam.

* * * * *